United States Patent [19]

Lucas et al.

[11] Patent Number: 4,542,348

[45] Date of Patent: Sep. 17, 1985

[54] HIGH EFFICIENCY IGFET OPERATIONAL AMPLIFIER

[75] Inventors: Charles H. Lucas, Newport Beach; Lanny L. Lewyn, Palo Alto, both of Calif.

[73] Assignee: Hughes Aircraft Company, Culver City, Calif.

[21] Appl. No.: 544,766

[22] Filed: Oct. 24, 1983

[51] Int. Cl.[4] .......................... H03F 3/30; H03F 3/45
[52] U.S. Cl. .................................. 330/253; 330/255; 330/269; 330/300
[58] Field of Search ............... 330/253, 255, 264, 269, 330/300

[56] References Cited

U.S. PATENT DOCUMENTS 4,284,957  8/1981  Haque .................................. 330/253
4,336,503  6/1982  Whatley .............................. 330/253

Primary Examiner—James B. Mullins
Attorney, Agent, or Firm—Joseph E. Szabo; Anthony W. Karambelas

[57] ABSTRACT

An operational amplifier circuit including an output stage which requires relatively low operating current to achieve a desired transconductance in order to permit improved driving of a capacitive load.

7 Claims, 3 Drawing Figures

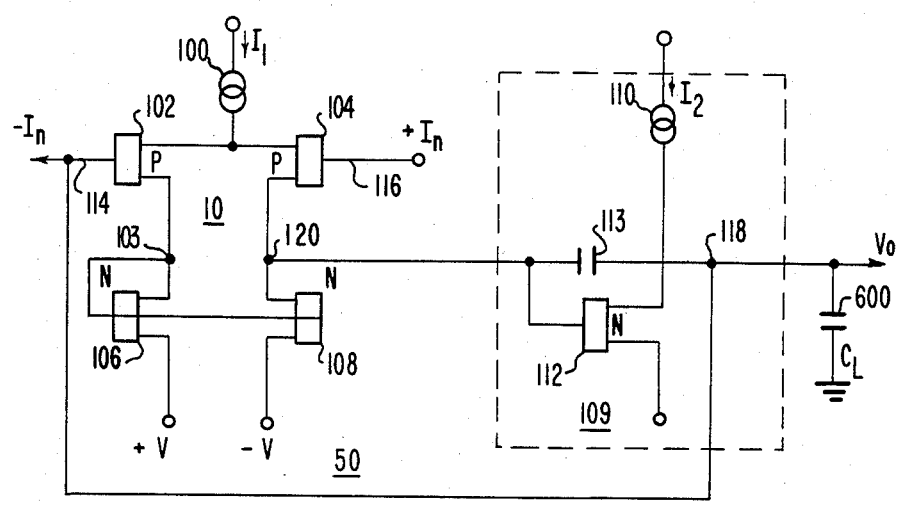
Fig. 1.
(PRIOR ART)
Fig. 2.
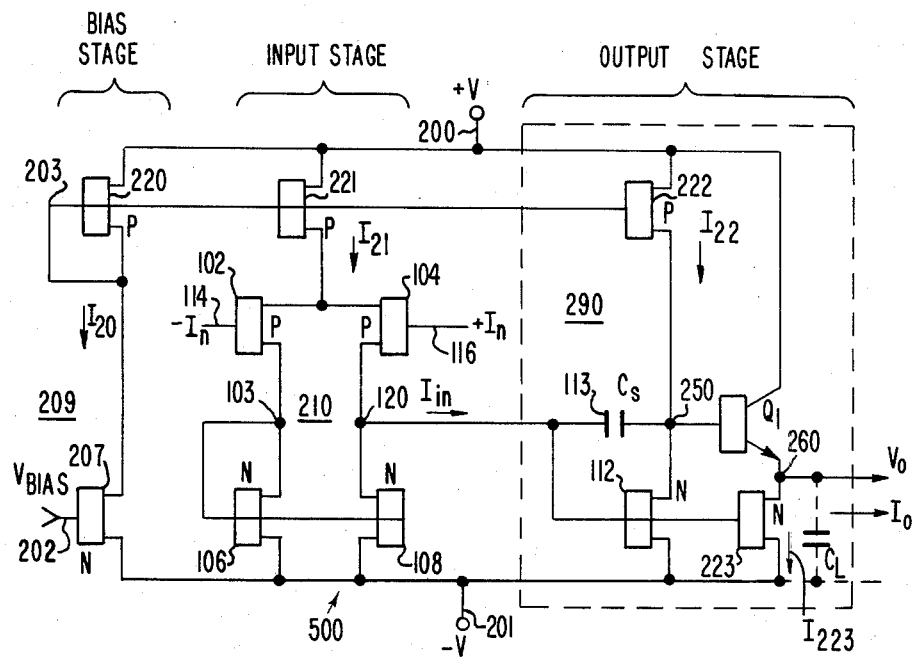

HIGH EFFICIENCY IGFET OPERATIONAL AMPLIFIER

BACKGROUND OF THE INVENTION

1. Field of the Invention

This invention relates to operational amplifier circuits, in general, and to the design of an output stage for an operational amplifier which provides an output voltage to a capacitive load, in particular. Capacitive loads are common to charge redistribution techniques used in insulated gate field effect transistor (IGFET) integrated systems.

2. Description of the Prior Art

The use of operational amplifiers to drive capacitive loads is well known in the prior art. The use of IGFET (Insulated Gate Field Effect Transistor) operational amplifiers in integrated system design is also known. Such amplifiers are often used to drive a capacitive load in a closed loop feedback configuration. Typically, such a closed loop has a characteristic settling time constant, $T_s$, which is a measure of the speed with which the output voltage $V_{out}$ will follow an input signal $V_{in}$.

In the prior art, the IGFET operational amplifier includes an output stage to drive the required load. The ability of the output stage to drive a capacitive load is evaluated by a characteristic time constant, $T_2$. In a well designed output stage, it is not unusual to require that $T_2$ be less than half of $T_S$.

The time constant $T_2$ is directly proportional to the value of the load capacitance, $C_L$, and inversely proportional to the value of output stage transconductance, $g_m$. That is, $T_2 = kC_L/g_m$ where transductance is a measure of the change in the output current which a device can produce in response to a change in input voltage. Consequently, in order for a typical prior art circuit to operate with a short time constant $T_2$, either the capacitive load must be kept small, or the transductance of the output device must be made large.

Usually, it is not practical to reduce capacitive loads below some minimum value which is characteristic of the charge redistribution networks to be driven. In existing integrated circuit technology, the minimum value of $C_L$ is on the order of 10 pf. Therefore, in order to shorten the response time, the transconductance of the output stage must be increased. Such an increase usually means supplying more current, more device area, or both. However, there is a practical limit to each of these possibilities.

Another approach is to provide a bipolar transistor buffer stage in front of the capacitive load, as is known in the prior art. It is well known that a bipolar transistor can supply the same transconductance as an IGFET device while operating with significantly less current because the emitter current of the buffer stage in the prior art device is greater than the base current, $I_B$, by the factor $(1+h_{fe})$, and it can easily be shown that the load capacitance, as seen looking into the buffer stage, has been reduced by the same factor. Such bipolar transistors are commonly supplied current by a constant current source which can add additional complexity and cumbersome design requirements to the circuitry involved.

The rate at which the constant current source can drive the load capacitance toward its supply rail is limited by the strength of the constant current source used in the output stage. Therefore, operating the bipolar transistor at a low current can reduce the pull down rate to an unacceptably low value.

It is desirable to provide an operational amplifier wherein it is possible to reduce the operating current requirements relative to the prior art circuit with a bipolar buffer stage but to retain a pulldown rate which exceeds the rate of the prior art circuit.

CROSS-REFERENCES

Applicants refer to the following copending U.S. patent applications the contents of which are incorporated herein in their entirety by reference:

CIRCUIT FOR EFFECTING IMPROVED SLEW RATE OF OPERATIONAL AMPLIFIERS; L. L. LEWYN and C. H. LUCAS, S.N. 486,644, filed Apr. 20, 1983, and now U.S. Pat. No. 4,500,846.

SAMPLE AND HOLD CIRCUIT WITH IMPROVED OFFSET COMPENSATION; C. H. LUCAS and L. L. LEWYN, U.S. Pat. No. 4,439,693, issued Mar. 27, 1984.

SUMMARY OF THE INVENTION

The invention is an operational amplifier circuit with an improved output stage which permits faster operation or reduced operating current as a result of reducing the effective load capacitance.

The improved output stage includes a field effect transistor (FET) as an active element in lieu of a constant current source of the prior art. A bipolar transistor is connected to the FET to provide enhanced transconductance without any requirement of increased output stage current.

Also, an isolating device, such as another FET (or a Darlington combination of FETs and bipolar transistors) can be included to improve the efficiency factor of the output stage, particularly at high frequencies, by isolating the gate capacitance of the active element FET from the operational amplifier input circuit, per se.

BRIEF DESCRIPTION OF THE DRAWINGS

FIG. 1 illustrates an IGFET operational amplifier including an output stage typical of the prior art.

FIG. 2 is a simplified schematic diagram of an embodiment of a complete operational amplifier including the new output stage.

DESCRIPTION OF A PREFERRED EMBODIMENT

Figure 3:
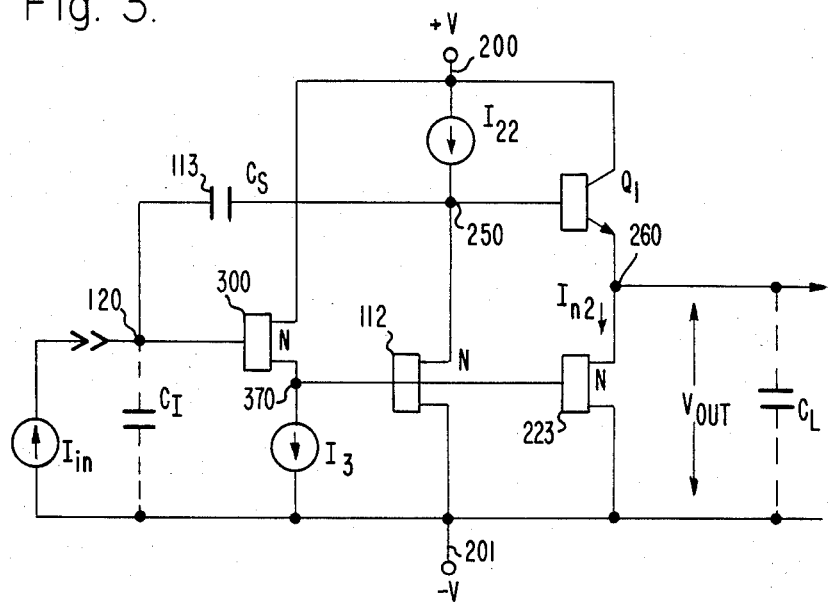
FIG. 3 is a schematic diagram of another embodiment of the new output stage including input buffering.

Referring now to FIG. 1, there is shown an operational amplifier 50 comprised of circuitry which is typical in the prior art and described in the copending application of Lewyn et al S.N. 486,644. In particular, operational amplifier 50 includes an input circuit 10 which is an FET circuit. Circuit 10 comprises a first current source 100 connected to the conduction path of each of a pair of P-type FETs 102 and 104 forming a differential input. A pair of N-type FETs 106 and 108 forming a current mirror, have the conduction paths thereof connected to FETs 102 and 104, respectively.

The conduction paths of FETs 106 and 108 are connected to the voltage sources $+V$ and $-V$, respectively. The gate electrodes of FETs 102 and 104 are connected to the negative (inverting) input terminal 114 and the positive (non-inverting) input terminal 116, respectively.

The gate electrodes of FETs 106 and 108 are connected together and to the common junction of the conduction paths of FETs 102 and 106. The common junction of the conduction paths of FETs 104 and 108 is the output terminal 120 of the operational amplifier first stage 10. An output stage 109, (shown within the dashed outline) comprises a second current source 110 connected to the conduction path of N-type FET 112. A stabilization capacitor 113 is connected between the gate electrode of FET 112 and the common junction of current source 110 and the drain of FET 112. In addition, the gate of FET 112 is connected to the output terminal 120.

The inverting input terminal 114 and the positive input terminal 116 are typical input terminals of an op amp. Output terminal 118 provides the output signal and corresponds to the output terminal of the op amp (i.e. operational amplifier). In a unity gain, unity return system, output terminal 118 is connected to the inverting input terminal 114.

The op amp 50 shown in FIG. 1 may be operated in various modes including a sample and reset mode to give a chopped output waveform when the input waveform is sinusoidal. A more important operation in conjunction with this discussion, however, is in response to a positive going "step" input signal at terminal 116. Ideally, the output signal $V_o$ should track the input signal $V_{in}$. However, $V_o$ can rise only at the maximum slew rate $dv/dt$ which is set by the second stage bias current $I_2$ from source 110 and the size of the load capacitor 600. The maximum positive slew rate, $dv/dt$, is expressed as $I_2/C_L$ and is commonly referred to as the output stage positive slew rate limit. Thus, $V_o$ will rise at this maximum slew rate until it nears $V_{in}$. Thereafter, $V_o$ will asymptotically converge toward $V_{in}$.

In prior art applications where the positive slew rate limit must be high and the load capacitor 600 is large, either the current source 110 would be increased to a large value or an NPN bipolar emitter follower stage would be added. In the case of the addition of the NPN emitter follower, it would require a constant current source $I_3$ (not shown) connected between the negative power supply rail and the emitter electrode of the NPN device. This current source value would have to be increased to the same value as current source 110 in the prior art circuit of FIG. 1 to achieve a negative slew rate $-dv/dt=I_3/C_L$. This slew rate is the same value as the second stage positive slew rate limit $dv/dt=I_2/C_L$ of the prior art FET output circuit of FIG. 1. Obviously then $I_3$ must equal $I_2$.

Referring now to FIG. 2, there is shown a schematic diagram of one embodiment of the present invention. The input stage 210 of operational amplifier 500 is substantially similar to the prior art devices and similar components bear similar reference numerals. Thus, a pair of P-type FETs 102 and 104 have conduction paths thereof connected to a current source, provided in this embodiment by a P-type FET 221. A pair of N-type FETs, 106 and 108, have the conduction paths thereof connected to the conduction paths of transistors 102 and 104, respectively.

The conduction paths of devices 106 and 108 are returned to one voltage supply source 201 which, in this instance, provides a voltage $-V$. The FETs 102 and 104 form the differential input of the op amp and the FETs 106 and 108 form the current mirror (as in the prior art).

A bias stage 209 includes a P-type FET 220 which has the conduction path thereof connected in series with the conduction path of N-type FET 207 and between the voltage supply busses 200 ($+V$) and 201 ($-V$). The gate electrode of device 220 is connected to the conduction path junction of FETs 220 and 207. The gate electrode of FET 207 is connected to node 202 to receive the bias voltage $V_{Bias}$.

The improved output stage 290, shown within the dashed outline, includes a P-type FET 222 which has the gate electrode thereof connected to the gate electrodes of FETs 220 and 221. In addition, FET 222 operates as a constant current source to supply current $I_{22}$.

The conduction path of device 222 is connected in series with the conduction path of N-type FET 112 between voltage busses 200 and 201. In similar fashion, the emitter-collector current path of NPN-type transistor Q1 is connected in series with the conduction path of FET 223 between busses 200 and 201. The gate electrodes of devices 112 and 223 are connected together and to node 120 (the output node) of op amp input stage 210. Stabilization capacitor 113 (having capacitance $C_s$,) is connected between node 120 and node 250 (which is the junction between the gate electrode of transistor Q1 and the conduction paths of devices 222 and 112). Output node 260 (at the junction of transistor Q1 and device 223) provides the output signals $V_o$ and $I_o$.

In the operation of the circuit, a voltage signal is applied differentially to the negative and positive input terminals 114 and 116 of the operational amplifier input stage 210. The voltage signals are converted to currents through the transconductance of the differential pair input devices 102 and 104. The current signals from FETs 102 and 104 are differenced and routed to the op amp output node 120 by the conventional IGFET current mirror consisting of devices 106 and 108. The current signal at node 120 is the input signal for the output stage 290. This operation of the input stage is conventional.

Current sources 221 and 222 furnish a constant bias current to the input and output stages, respectively. Devices 221 and 222 operate with device 220 to form a current mirror as a result of the common gate connection at node 203. Devices 220 and 221, thus, mirror the constant current $I_{20}$ provided by bias device 207. It should be noted that the W/L (Width-to-Length) ratios chosen for devices 220 and 221 allow bias currents $I_{20}$ and $I_{21}$ to be chosen independently.

When a negative going current, $I_{in}$, at node 120 causes the gate voltage of device 112 to be reduced, the drain current of device 112 falls below its quiescent value which is almost equal to the constant current bias source $I_{22}$. As the drain current of device 112 falls, current from device 222 charges the stabilization capacitor 113 and increases the base current supplied to bipolar transistor Q1. Thus, a large increase in the emitter current of transistor Q1 is then produced. At the same time, the voltage at node 120 and the gate of IGFET device 223 is decreasing while the emitter current of transistor Q1 is increasing. Thus, a large output current signal, $I_o$, which is the difference between the emitter current of transistor Q1 and the drain current of FET 223, results and, as a consequence, the load capacitance $C_L$ is driven positive.

In other words the addition of transistor Q1 significantly improves the output slew rate in the positive direction. That is, the $h_{fe}$ of transistor Q1 is available to boost the output current $I_O$ to a high value even for significantly lower values of bias current $I_{22}$ relative to bias current $I_2$ in the prior art circuit (see FIG. 1). In the case where bias current $I_{22}$ is made the same value as the bias current $I_2$ of the prior art circuit, and the $h_{fe}$ of transistor Q1 has a value of 100 (which is readily achievable in present 3 micron semiconductor fabrication processes), the value $C_L$ of the load capacitor 251 can be 100 times the value $C_S$ of the stabilization capacitor 113, without limiting the positive slew rate of the output stage below that of the prior art circuit.

The output stage current efficiency may be improved inasmuch as transistor Q1 requires significantly less current than device 112 in the prior art circuit (see FIG. 1), in order to provide the same transconductance $g_m = I_{223}/V_T$, where $I_{223}$ is the current through device 223 and $V_T$ is the thermal voltage $KT/g$, where K is the Boltzman constant, T is the absolute temperature in degrees Kelvin, and q is the unit electronic charge.

In other words, the output stage current can be reduced by more than the factor $1/n$ (e.g. $1/n+1$) and yet maintain the same transconductance as device 112 in the prior art. The prior art circuitry sometimes used an additional emitter follower at the output of the op amp as a load buffer. However, the output stage slew rate toward the negative supply rail would be limited by the value of the follower constant current source.

In the embodiment shown in FIG. 2, the current of FET 223 can increase substantially in response to a positive going input signal at node 120 (i.e. the input node for output stage 200). This increase in current permits the output stage slew rate in the negative direction to be substantially larger than was possible in the prior art where the prior art included an emitter follower buffer stage with a constant current source which supplied a current equal in value to the quiescent current of FET 223 of the instant invention.

In P-well CMOS fabrication, the vertical NPN bipolar device is of straightforward, standard construction. The N+ diffusion used to make the source or drain of the N channel transistors is the emitter; the base is the P-well; the N collector is the N-substrate. (Because fabrication of a complementary PNP device is not possible in P-well CMOS technology, a MOS device such as FET 223 is required.)

FIG. 3 shows an alternative embodiment of the output stage. For convenience, the op amp 210 input related circuitry is omitted in this Figure. Other components which are similar to previously described components bear similar reference numerals. It will be seen that IGFET device 300 has been added between node 120 and the gate electrode of device 112. In particular, the gate electrode of device 300 is connected to node 120 while the conductive path of device 300 is connected between the voltage bus 200 (+V) and the gate electrode of device 112. The input capacitance, $C_I$, of the output stage, is shown in dashed outline and is measured between node 120 and low voltage bus 201.

In this embodiment, the N-type device 300 operates to reduce the capacitance loading at node 120 from the gates of devices 112 and 223. Device 300 isolates the gate capacitances by driving devices 112 and 223 with its source output at node 370. The reduction of the input capacitance relative to ground at node 120 allows the use of a smaller stabilization capacitor 113 in high frequency applications (e.g. 10 MHz). For these applications the attenuation of the capacitive voltage divider from node 250 to node 120 (i.e. $C_S/C_I$) should be maintained well above 0.5.

Thus, there is shown and described a new and improved operational amplifier output stage circuit. This circuit permits improved utilization of operational amplifier circuits in that larger output capacitance loads can be driven without increasing current requirements in the circuitry. This is especially important in the case of integrated circuit fabrication wherein current availabilities are limited.

While the embodiment shown and described is primarily directed to CMOS devices, other applications are also contemplated. Also, it should be understood that alternative arrangements can be made. For example, the isolation device (FET 300) can be replaced by a bipolar device or by a multiple-device Darlington configuration which can be any combination of IGFET or bipolar devices. Also, bipolar transistor Q1 can be replaced by an N-channel IGFET device in some applications.

The preferred embodiment is described. However, this particular description is intended to be illustrative only and is not intended to be limitative of the invention. Any modifications which fall within the purview of this description are intended to be included therein as well. The scope of the invention is limited only by the claims appended hereto.

We claim:

1. An improved operational amplifier circuit including an input stage and an output stage,
   said output stage comprising,
   a current conducting device connected to receive a signal from the output terminal of said input stage,
   first FET means connected to the conduction path of said current conducting device, and
   second FET means directly connected to the control electrode of said current conducting device,
   said first and second FET means having their control electrodes directly connected to said output terminal of said input stage.

2. The circuit recited in claim 1 including,
   stabilization capacitance means connected between said output terminal of said input stage and the control electrode of said current conducting device.

3. The circuit recited in claim 1 including,
   constant current source means directly connected to said control electrode of said current conducting device.

4. The circuit recited in claim 1 wherein,
   a load capacitance is connected to the common junction between said current conducting device and said first FET means.

5. The circuit recited in claim 1 wherein,
   said current conducting device comprises an NPN bipolar device.

6. The circuit recited in claim 1 wherein,
   said operational amplifier circuit is fabricated of CMOS devices on a single chip.

7. The circuit recited in claim 6 wherein,
   said current conducting device is a bipolar transistor device fabricated on said single chip.

* * * * *